United States Patent [19]

Walkington et al.

[11] Patent Number: 5,604,439
[45] Date of Patent: Feb. 18, 1997

[54] TRACTOR/TRAILER LAMP CIRCUIT CONTINUITY TEST DEVICE

[76] Inventors: Clifford L. Walkington, 39 Selth Street, Albert Park, South Australia, Australia, 5014; Lindsay R. Grist, 5 Kanangra Road, Seaview Downs, South Australia, Australia, 55049

[21] Appl. No.: 351,438

[22] PCT Filed: Apr. 15, 1994

[86] PCT No.: PCT/AU94/00190

§ 371 Date: Mar. 10, 1995

§ 102(e) Date: Mar. 10, 1995

[87] PCT Pub. No.: WO94/24577

PCT Pub. Date: Oct. 27, 1994

[30] Foreign Application Priority Data

Apr. 15, 1993 [AU] Australia .................. PL8318

[51] Int. Cl.[6] .................................................. G01R 31/02
[52] U.S. Cl. .................. 324/504; 324/133; 324/556; 340/431
[58] Field of Search .................... 324/66, 503, 504, 324/556, 133; 340/431, 458, 642

[56] References Cited

U.S. PATENT DOCUMENTS

| 3,663,939 | 5/1972 | Olsson | 324/504 X |
| 3,836,843 | 9/1974 | Yonce | 324/504 |
| 3,944,915 | 3/1976 | Yonce | 324/504 |
| 4,002,972 | 1/1977 | Konrad et al. | 324/503 X |
| 4,166,242 | 8/1979 | Spiteri | 324/504 |
| 4,547,722 | 10/1985 | Sarlo | 324/504 |
| 4,866,390 | 9/1989 | Butchko | 324/504 |
| 4,884,032 | 11/1989 | LaPensee | 324/504 |
| 5,086,277 | 2/1992 | Hammuly | 324/504 |
| 5,095,276 | 3/1992 | Nepil | 324/504 |
| 5,192,912 | 3/1993 | Lemon | 324/504 |
| 5,416,421 | 5/1995 | Doland, Sr. et al. | 324/504 X |

FOREIGN PATENT DOCUMENTS

| 0039122 | 11/1981 | European Pat. Off. | |
| 3149115 | 6/1983 | Germany | 324/504 |

*Primary Examiner*—Kenneth A. Wieder
*Assistant Examiner*—Diep Do
*Attorney, Agent, or Firm*—Watts, Hoffmann, Fisher & Heinke Co. LPA

[57] ABSTRACT

An auxiliary plug-and-socket assembly (28) has a plurality of pins (29) at one end which plug into a socket (30) at the rear end of a tractor vehicle (31) and sockets (32) at the other end which receive a plug (33) from a trailer vehicle. The auxiliary assembly (28) also has conductors (38) which extend between corresponding pins (29) and sockets (32), light emitting diodes (20–25) in respective circuits between conductors (38) and a common ground pin and socket, a gating diode (37), and an energizer (17) and switch (34) bridging the gating diode (37).

13 Claims, 6 Drawing Sheets

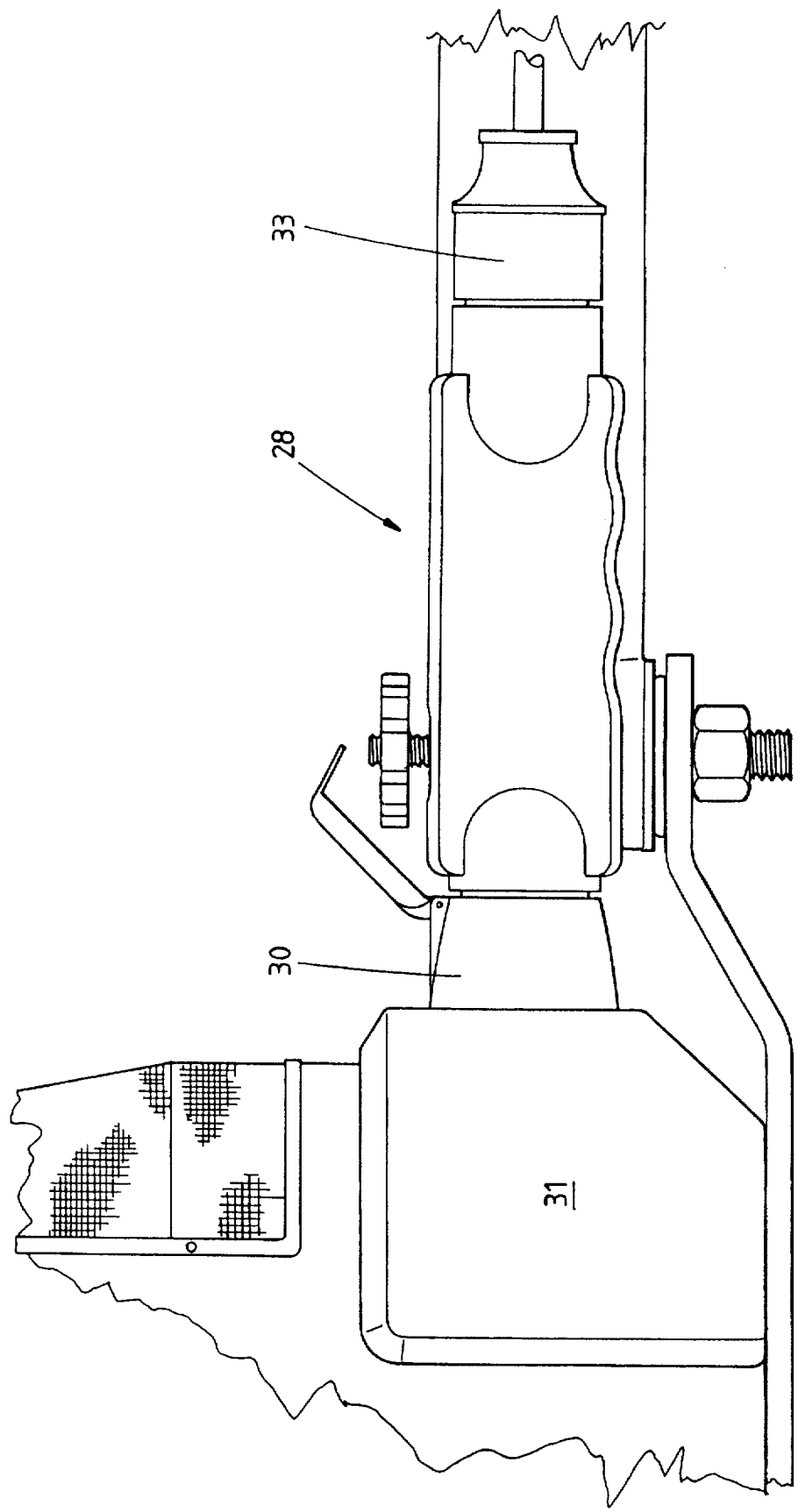

TRACTOR/TRAILER LAMP CIRCUIT CONTINUITY TEST DEVICE

BACKGROUND OF THE INVENTION

At the present time, it is usually required to have two people to test the functions of a trailer light configuration, one being required to stand behind the trailer and the other being required to operate the controls within the cabin of a vehicle (for example a truck), including the turning lamps, the tail light and the brake light. Particularly with the brake light, it is not reasonably feasible for a single operator to ascertain whether or not his brake lights are functioning.

However, there is frequently a requirement to test lamps of a number of trailer vehicles which may be in a yard, and otherwise ready to depart. In such cases, the time delays associated with such testing are unacceptable. The alternative used has been for a large battery to be wheeled from trailer to trailer, and the function of each trailer lamp circuit to be separately tested. This alternative is still unacceptably slow, and often very inconvenient.

In most countries however it is a legal requirement that all trailer lights should function, and therefore it is necessary for tests to be undertaken, usually before each time a trailer is used.

Problems with circuits of various types have been recognized, and reference may be made to Australian Patent 488353 (Lansing Bagnail) dealing with monitoring current leakage in electric trucks, Australian application 20575/76 (Deere & Company), dealing with determination of continuity in an electric circuit, and Australian Patent 495113 (General Signal Corporation) dealing with ground fault detection. Other less relevant prior art includes Australian Patents 545161 (Lockheed), 501552 (Westinghouse), 497189 (Secheron), Application 87806/91 (British Aerospace) and 585846 (Glover).

None of these however employs the combination of separate testing of the circuits of a trailer by energising those circuits through a lamp or lamps, in addition to testing a tractor plug to ensure existence of available energy for the circuits.

BRIEF SUMMARY OF THE INVENTION

In this invention, a simple device can be plugged into a socket, or receive the plug of a plug-and-socket tractor/trailer connection, and test all the trailer circuits and their respective signal lamps by energising a test lamp from an energiser carried by the device through the trailer circuits to ground, by rotation of a rotary switch, or alternatively energise a number of test lamps simultaneously or sequentially by a push button operation, a separate test lamp for each trailer circuit. At the same time, the part of the plug-and-socket connection on a tractor vehicle may be tested to ensure that energy is transmitted when the respective switches are closed by a driver.

BRIEF DESCRIPTION OF THE DRAWINGS

Two embodiments of the invention are described hereunder in some detail with reference to and are illustrated in the accompanying drawings wherein:

FIG. 1 is a fragmentary drawing showing the use of the test device when inserted between a tractor and trailer vehicle;

FIG. 4a is a top view of a device according to a second and preferred embodiment;

FIG. 4b is an end view of the male portion of FIG. 4a;

FIG. 4c is an end view of the female portion of FIG. 4a;

DETAILED DESCRIPTION

Figure 2A:
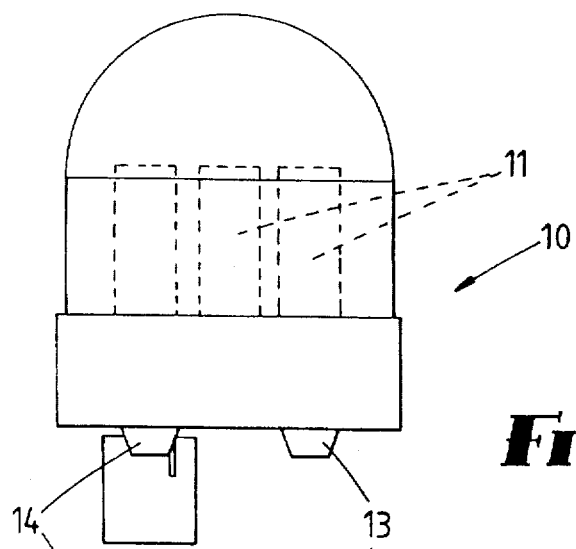
FIG. 2a is a top view of a seven pin trailer socket assembly.
Figure 2B:
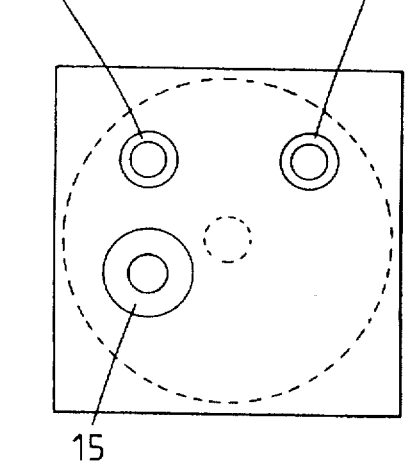
FIG. 2b is an end view.
Figure 2C:
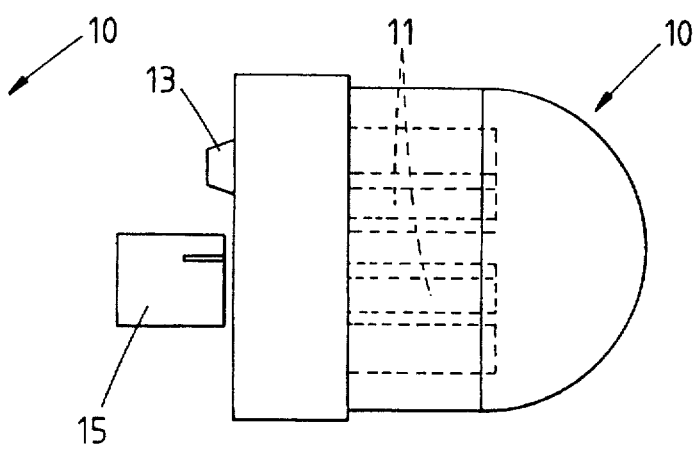
FIG. 2c is a side view.

Referring to the first embodiment of FIGS. 2a, 2b, 2c and 3, a seven pin trailer socket assembly 10 comprises a plurality of plug pin sockets 11 (within a dome shaped removable cover) adapted to receive the pins of a plug of a trailer vehicle (not shown), the sockets 11 being arranged in a conventional seven pin configuration. A seven pin configuration socket is standard, since it will receive either a five pin plug or a seven pin plug both of which are also standard and conventional. Other configurations can be readily adapted by changing socket arrangements.

The socket assembly 10 comprises a green light emitting diode 13, a red light emitting diode 14, and a rotary selector switch 15.

Figure 3:
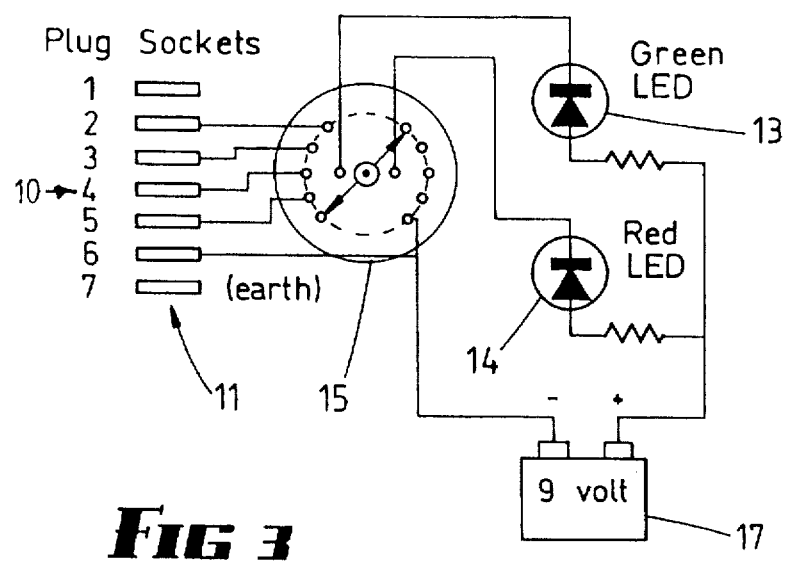
FIG. 3 is a circuit diagram of a first embodiment utilising a rotary switch.
Figure 4:
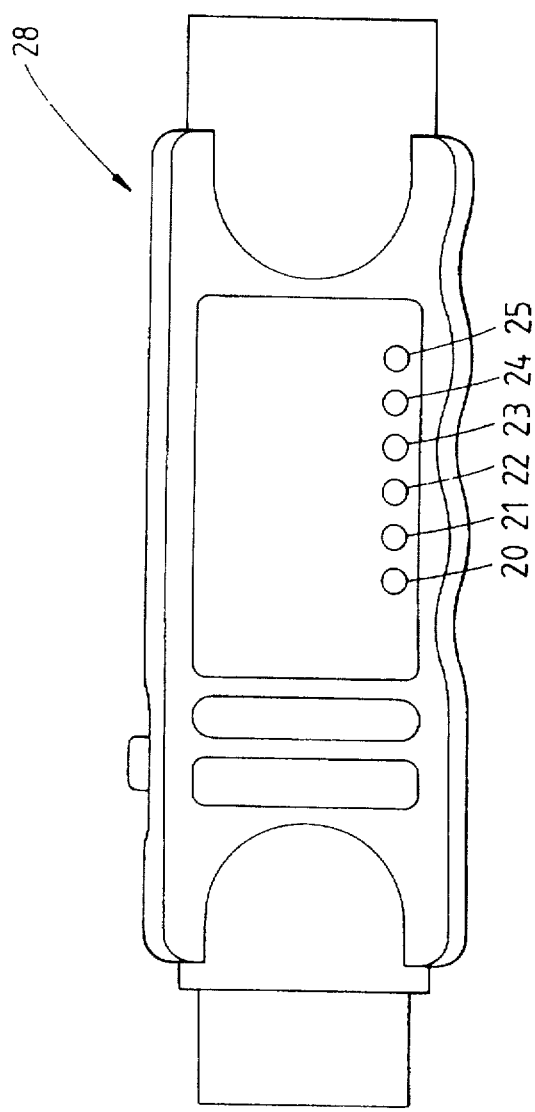

FIG. 3 illustrates the very simple circuit diagram wherein a 9 volt energiser 17 has its negative lead going directly to pin 6 (the ground or earth pin of the plug 11, constituting a common conductor), and the wiper of the rotary selector switch 15 selectively contacts sockets 2, 3, 4 and 5 of the rotary switch 15 (for a five pin mode trailer) or 1 through to 6 (for a seven pin mode). The red LED 14 indicates the existence of sufficient EMF of energiser 17, and the green LED indicates continuity of circuit from the plug through the lamps and back to the plug. It may be noted that the rotary selector switch 15 provides an automatic separation of the tested circuits, which is otherwise required to be separated by gating diodes as described hereunder.

The second embodiment which is illustrated in FIGS. 1, 4a, 4b, 4c and 5 illuminates the light emitting diodes L1 through to L6 (identified by numerals 20 to 25) simultaneously when they are being checked. In order to do this, there is provided an auxiliary plug-and-socket assembly 28 which has a plurality of pins 29 (FIG. 4b) at its left hand end which plug into a socket 30 at the rear end of a tractor vehicle 31 and sockets 32 at its right hand end (FIG. 4c) which receive a plug 33 from a trailer vehicle. The sockets 32 are identical to the original equipment 30 so that the auxiliary assembly 28 can be removed and the plug 33 repositioned in the socket 30 after a test has been conducted. This embodiment provides a facility whereby separate testing of tractor and trailer individually can take place, as well as when they are coupled together.

Figure 5:
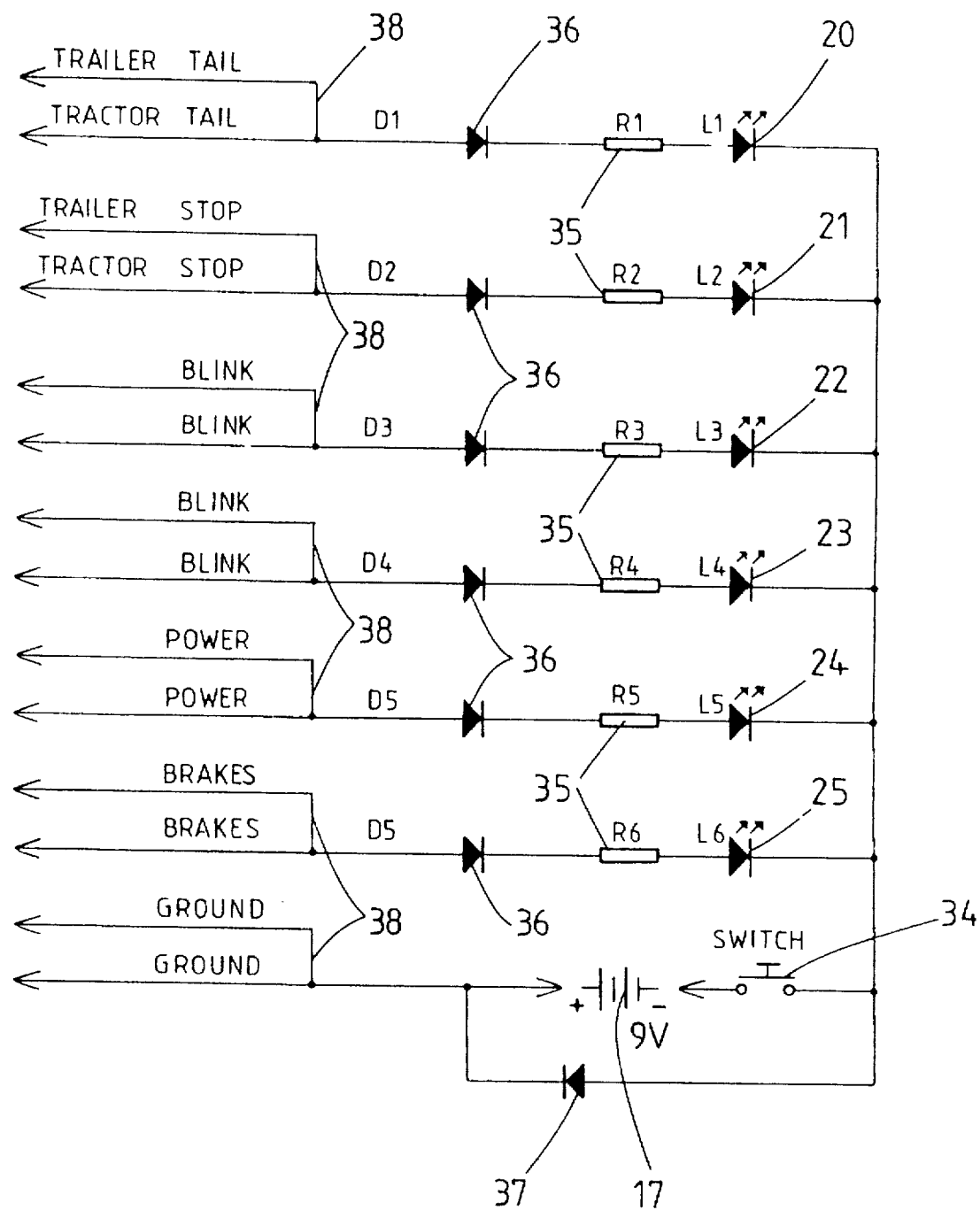
FIG. 5 is a circuit diagram which illustrates the circuit of the preferred second embodiment.

FIG. 5 illustrates the electrical circuit for the second and preferred embodiment, wherein a 9 volt energiser 17 energises the respective trailer circuits through the LEDs 20 to 25 simultaneously upon closure of the push button switch 34, each through a respective resistor 35 and gating diode 36. Because ground (earth) is common to all circuits, it is necessary for the polarity of energiser 17 to be reversed with respect to the main power supply from the vehicle. The diode 37 provides a by-pass gate for the energiser 17.

The second embodiment is preferred to the first, mainly because it provides a function for checking the wiring from the tractor vehicle battery to the socket 30. Whether or not the plug 33 is removed, and the tractor tail light switch turned ON, the tractor tail light socket of plug 30 will be illuminated via diode 36, resistor 35, diode 20 (the first light emitting diode) and gating diode 37 to ground, and this is repeated for all the other light emitting diodes 21 through to 25 for the respective tractor coupled circuits. The auxiliary plug and socket assembly is provided with conductors 38 which extend between corresponding pins 29 and sockets 32, so that in use the trailer circuits and tractor circuits are placed in parallel. If however, the auxiliary assembly 28 is removed from socket 30, push button 34 will cause simultaneous illumination of respective light emitting diodes 20 through to 25 if all the trailer circuits are sound. Thus circuit continuity is readily checked for both tractor and trailer vehicles. Absence of illumination on a corresponding LED indicates a circuit fault.

Even if all the tractor vehicle circuits are energised simultaneously and the switch 34 is closed, the additional current is not sufficient to damage the light emitting diodes.

Diode 37 protects the battery from being reverse charged if flat.

With the arrangement shown, LED's 20, 21, 22 and 23 will be illuminated, for example upon closure of switch 34 for a seven pin configuration, and LED's 22, 23, 24 and 25 for a five pin configuration. This provides a convenient check of the trailer and tractor wiring mode.

Figure 6:
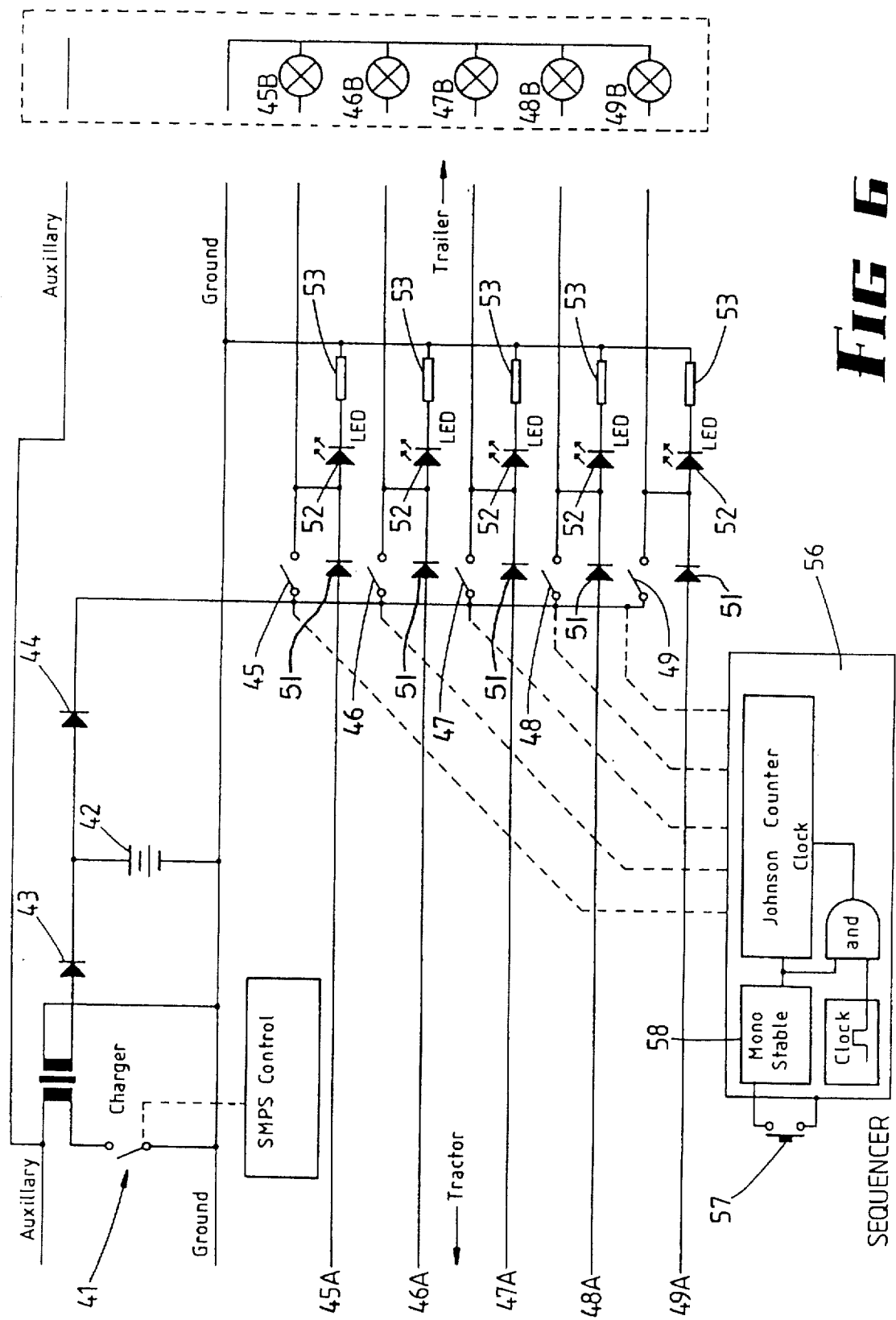
FIG. 6 illustrates a further embodiment utilising a sequencer to control energising the various circuits of a trailer in sequence.
Figure 7:
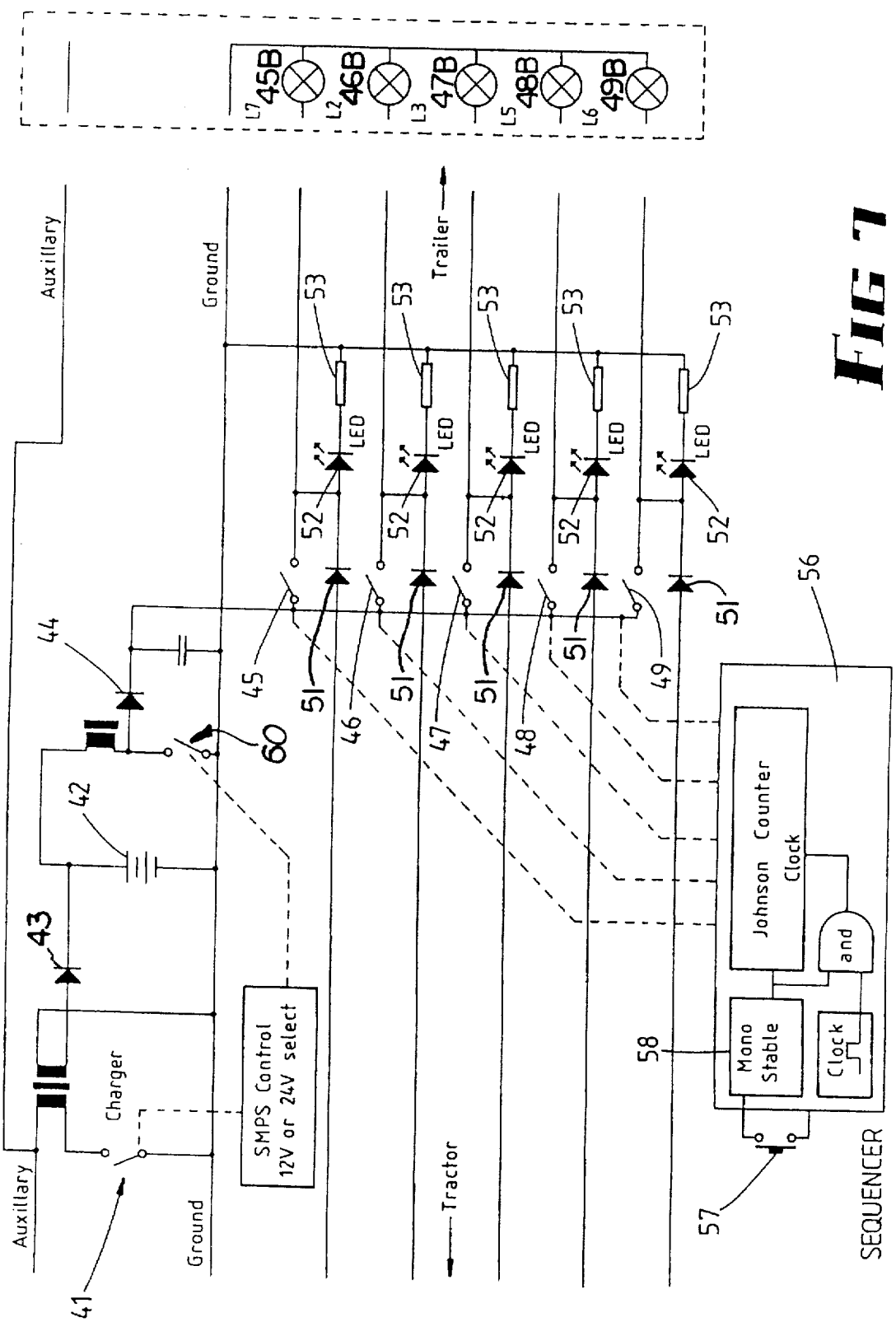
FIG. 7 illustrates the embodiment of FIG. 6 with the additional feature of an inverter to provide a 12 volt/24 volt option.

FIGS. 6 and 7 illustrate two alternative circuits which are basically very similar. FIG. 7, however, includes an inverter circuit which will ensure full voltage is always available for both a 24 and 12 volt system, FIG. 7 being preferred because many prime movers requiring use of the testing facilities of this invention are wired for 24 volts.

Referring first to FIG. 6, a switch mode power supply 41 of known type provides a charger for charging a 12 volt energiser 42 through a diode 43, and a second gating diode 44 feeds the switches 45 through to 49 associated with tractor light circuits, and switches switching through the Schotky diodes 51 and the respective light emitting diode 52 and their respective resistors 53 to the trailer lights 45b through to 49b.

A sequencer of 56 is initiated by a switch button 57 and sequentially closes the switches 45 through to 49 and repeats for a time which is controlled by a time-out timer clock 58, the sequencer and timer being conventional and in accordance with prior art. The time-out timer, for example, can limit the time of operation of a sequencer 56 to say 25 seconds which would normally give an operator time to ensure that all lights were operative, the lights coming on in turn as the various switches close.

The alternative to the FIG. 6 configuration is shown in FIG. 7 which enables a single tester to be used for both 12 and 24 volts, there being provided a change over switch 60 for that purpose. Since most of the elements are similar in FIGS. 6 and 7, similar elements bear similar designation numerals. However, the changeover switch 60 introduces the elements of inverter of known type which performs the function of providing alternatively the 12 volt or 24 volt supply for testing the lights 46B to 49B.

What is claimed is:
1. A tractor/trailer lamp circuit continuity test device for a tractor and trailer, the tractor having tractor circuits coupled to a tractor socket and the trailer having trailer circuits coupled to a trailer plug, the tractor/trailer lamp circuit continuity test device comprising:
   a) an assembly plug adapted for removable connection to the tractor socket, the assembly plug comprising a ground pin and a plurality of other pins;
   b) an assembly socket adapted for removable connection to the trailer plug, the assembly socket comprising a ground socket sleeve and a plurality of other socket sleeves;
   c) a ground conductor coupled in common to the ground pin and to the ground socket sleeve;
   d) a plurality of other conductors, each other conductor coupled to a respective one of the other pins and coupled to a respective one of the other socket sleeves;
   e) an energizer having a positive terminal and a negative terminal;
   f) a switch coupled in series with the energizer;
   g) a gating diode coupled to bridge across the series-coupled energizer and switch; and
   h) a plurality of light emitting diodes,
   wherein each light emitting diode is coupled to a respective one of the other conductors and is coupled in common to the series-coupled energizer and switch,
   wherein the series-coupled energizer and switch is coupled between the ground conductor and the light emitting diodes such that the positive terminal of the energizer is coupled to the ground conductor and the negative terminal of the energizer is coupled in common to each light emitting diode,
   wherein activation of a continuous one of the tractor circuits energies a respective one of the light emitting diodes when the assembly plug is connected to the tractor socket by creating a respective circuit through a respective one of the other pins, the respective one light emitting diode, the gating diode, and the ground pin, and
   wherein activation of the switch energizes a respective one of the light emitting diodes for a continuous one of the trailer circuits when the assembly socket is connected to the trailer plug by creating a respective circuit from the positive terminal of the energizer and through the ground socket sleeve, the respective one continuous trailer circuit, a respective one of the other socket sleeves, and the respective one light emitting diode to the negative terminal of the energizer.

2. The tractor/trailer lamp circuit continuity test device of claim 1, comprising a plurality of diodes, each coupled in series with a respective one of the light emitting diodes.

3. The tractor/trailer lamp circuit continuity test device of claim 2, comprising a plurality of resistors, each coupled in series with a respective one of the light emitting diodes.

4. An assembly for testing circuit continuity, the assembly comprising:
   a) an energizer having a positive terminal and a negative terminal;
   b) a first electrical connector;
   c) a second electrical connector;
   d) a first conductor coupled in common to the first electrical connector, to the second electrical connector, and to the positive terminal of the energizer;

e) a plurality of third electrical connectors;

f) a plurality of fourth electrical connectors;

g) a plurality of second conductors, each second conductor coupled to a respective one of the third electrical connectors and coupled to a respective one of the fourth electrical connectors; and h) a plurality of test lamps, each test lamp coupled to a respective one of the second conductors and coupled in common to the negative terminal of the energizer, wherein a respective one of the test lamps is energized when the second electrical connector and a respective one of the fourth electrical connectors are connected to continuous circuitry to create a respective circuit from the positive terminal of the energizer and through the second electrical connector, the continuous circuitry, the respective one of the fourth electrical connectors, and the respective one test lamp to the negative terminal of the energizer.

5. The assembly of claim 4, comprising a switch coupled in series with the energizer, wherein activation of the switch energizes the respective one test lamp.

6. The assembly of claim 5, wherein the switch is coupled to the negative terminal of the energizer and is coupled in common to each test lamp.

7. The assembly of claim 4, comprising a bypass gate coupled to bridge across the energizer, wherein activation of continuous circuitry coupled to the first electrical connector and to a respective one of the third electrical connectors energizes a respective one of the test lamps by creating a respective circuit through the respective one of the third electrical connectors, the respective one test lamp, the bypass gate, and the first electrical connector.

8. The assembly of claim 7, wherein the bypass gate is a gating diode.

9. The assembly of claim 4, wherein the test lamps are light emitting diodes.

10. The assembly of claim 4, wherein the first electrical connector and the third electrical connectors are pins.

11. The assembly of claim 4, wherein the second electrical connector and the fourth electrical connectors are sockets.

12. The assembly of claim 4, comprising a plurality of diodes, each coupled in series with a respective one of the test lamps.

13. The assembly of claim 4, comprising a plurality of resistors, each coupled in series with a respective one of the test lamps.

* * * * *